(12) United States Patent
Liu

(10) Patent No.: US 7,699,501 B2
(45) Date of Patent: Apr. 20, 2010

(54) LED ILLUMINATING DEVICE AND LIGHT ENGINE THEREOF

(75) Inventor: Tay-Jian Liu, Taipei Hsien (TW)

(73) Assignee: Foxconn Technology Co., Ltd., Tu-Cheng, Taipei Hsien (TW)

( * ) Notice: Subject to any disclaimer, the term of this patent is extended or adjusted under 35 U.S.C. 154(b) by 11 days.

(21) Appl. No.: 12/255,651

(22) Filed: Oct. 21, 2008

(65) Prior Publication Data

US 2009/0237937 A1     Sep. 24, 2009

(30) Foreign Application Priority Data

Mar. 19, 2008    (CN)   ........................ 2008 1 0066118

(51) Int. Cl.
*F21V 29/00*     (2006.01)
(52) U.S. Cl. ........................ 362/294; 362/373; 362/800
(58) Field of Classification Search ................. 362/800, 362/294, 373
See application file for complete search history.

(56) References Cited

U.S. PATENT DOCUMENTS

| | | | |
|---|---|---|---|
| 6,910,794 B2* | 6/2005 | Rice | ............................. 362/547 |
| 7,300,187 B2* | 11/2007 | Huang et al. | ................. 362/373 |
| 7,431,475 B2* | 10/2008 | Hafuka et al. | ................ 362/218 |
| 7,488,093 B1* | 2/2009 | Huang et al. | ................. 362/294 |
| 7,543,960 B2* | 6/2009 | Chang et al. | ................. 362/294 |
| 7,547,124 B2* | 6/2009 | Chang et al. | ................. 362/373 |
| 2009/0040759 A1* | 2/2009 | Zhang et al. | ................. 362/249 |
| 2009/0097241 A1* | 4/2009 | Xu et al. | ...................... 362/234 |

* cited by examiner

*Primary Examiner*—Anabel M Ton
(74) *Attorney, Agent, or Firm*—Frank R. Niranjan

(57) ABSTRACT

An LED illuminating device includes an optical section (10), an electrical section (30), and a heat dissipation section (20) arranged between the optical section (10) and the electrical section (30). The heat dissipation section is provided with a heat dissipation device (200) which includes a heat sink (23), a mounting seat (24), and a heat pipe (22) connecting the mounting seat with the heat sink. The heat sink includes a solid base (231) and a plurality of fins (232) extending radially and outwardly from the base. The base is provided with a through hole (233). A light source (11) is provided in the optical section and attached to the mounting seat. The heat pipe includes an evaporating portion (222) attached to the mounting seat, and a condensing portion (221) fittingly received in the through hole of the base.

14 Claims, 7 Drawing Sheets

LED ILLUMINATING DEVICE AND LIGHT ENGINE THEREOF

BACKGROUND

1. Technical Field

Embodiments of the present invention generally relates to light emitting diode (LED) illuminating devices, and particularly to an LED illuminating device with a high heat dissipating efficiency and a light engine of the LED illuminating device.

2. Description of Related Art

Presently, LEDs (light emitting diodes) are preferred for use in LED illuminating devices rather than CCFLs (cold cathode fluorescent lamps) due to a high brightness, a long lifespan, and a wide color range of the LED.

For an LED, eighty percents to ninety percents of the power consumed by the LED is converted into thermal energy, and only ten percents to twenty percents of the power consumed by the LED is converted into light. In addition, a plurality of LEDs are generally packaged in a single LED illuminating device in order to obtain a desirable illumination brightness. Therefore, heat dissipation of the LED illuminating device is a problem inhibiting the application of the LED illuminating device, which requires to be resolved.

For a high brightness LED illuminating device, a highly efficient heat dissipation device is necessary in order to timely and adequately remove the heat generated by the LED illuminating device. Otherwise, the brightness, lifespan, and reliability of the LED illuminating device will be seriously affected. Conventional heat dissipation devices, such as heat sinks or a combination of heat sink and cooling fan, can no longer satisfy the heat dissipation requirement of the high brightness LED illuminating device.

For heat dissipation purposes, heat pipes are well known due to having an excellent heat transfer performance. The heat pipe has a low thermal resistance in heat transfer due to a phase change mechanism of working fluid employed in the heat pipe. If the heat pipe technology is applied to the high brightness LED illuminating device, the heat dissipation requirement of the high brightness LED illuminating device may be satisfied.

SUMMARY

The present invention relates to an LED illuminating device. According to an exemplary embodiment of the present invention, the LED illuminating device includes an optical section disposed at a front end of the LED illuminating device, an electrical section disposed at a rear end of the LED illuminating device, and a heat dissipation section disposed between the optical section and the electrical section. A light source is provided in the optical section. The electrical section is electrically connected with the light source. The heat dissipation section is provided with a heat dissipation device. The heat dissipation device includes a heat sink, a mounting seat extending into the optical section, and a heat pipe connecting the mounting seat with the heat sink. The heat sink includes a solid metal base and a plurality of metal fins extending radially and outwardly from the metal base. The metal base is provided with a through hole. The light source is attached to the mounting seat. The heat pipe includes an evaporating portion and a condensing portion. The condensing section of the heat pipe is fittingly received in the through hole of the metal base. The evaporating portion of the heat pipe is mounted to the mounting seat.

Other advantages and novel features of the present invention will become more apparent from the following detailed description of embodiments when taken in conjunction with the accompanying drawings.

DETAILED DESCRIPTION OF THE EMBODIMENTS

Figure 1:
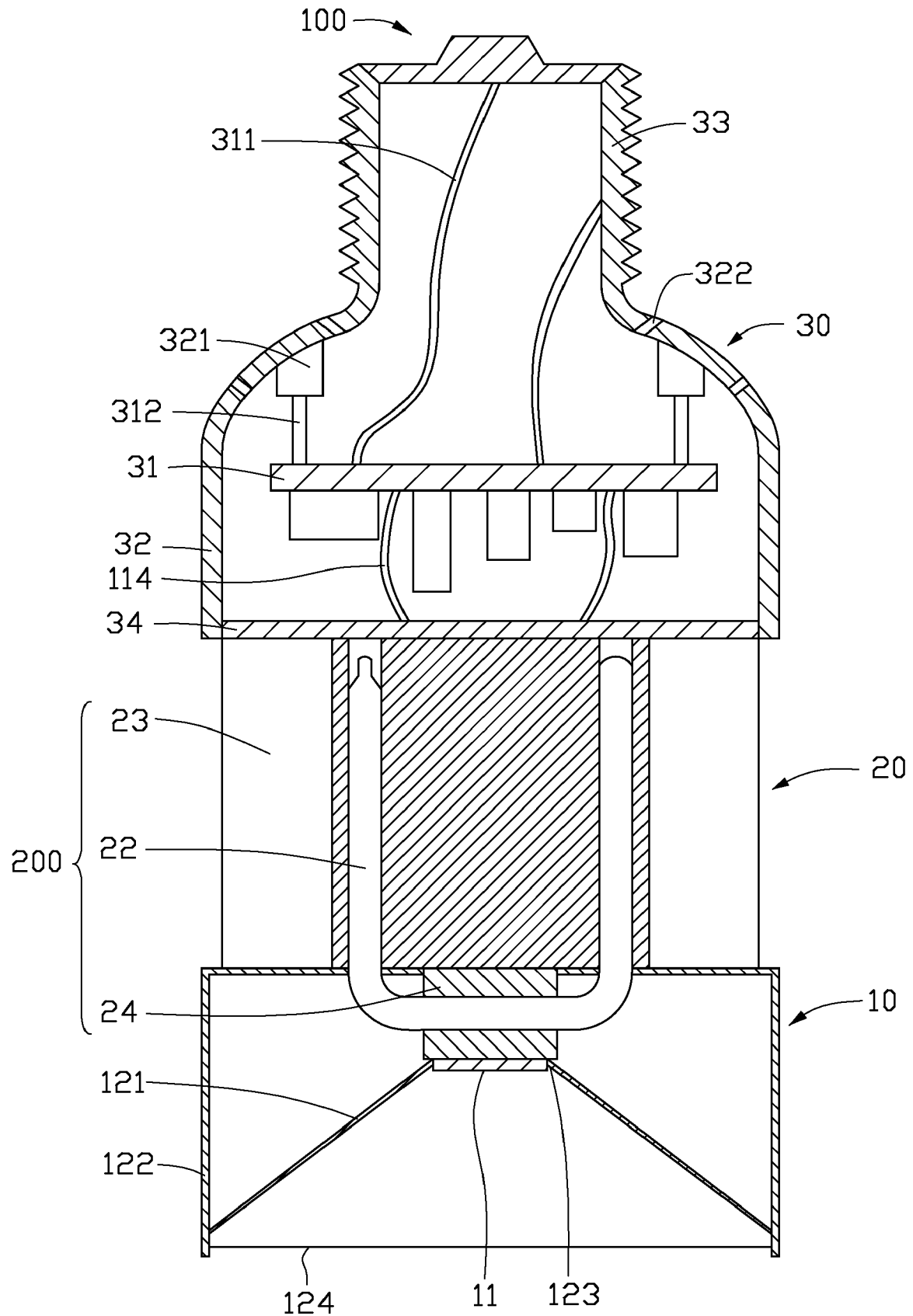
FIG. 1 is a cross-sectional view of an LED illuminating device in accordance with an embodiment of the present invention.

Reference will now be made to the drawing figures to describe the various embodiments in detail.

FIG. 1 is a cross-sectional view of an LED illuminating device 100 in accordance with an embodiment of the present invention. The LED illuminating device 100 includes an optical section 10, an electrical section 30, and a heat dissipation section 20 arranged between the optical section 10 and the electrical section 30. The LED illuminating device 100 is substantially cylindrical. The optical section 10 is disposed at a front end of the LED illuminating device 100, while the electrical section 30 is disposed at a rear end of the LED illuminating device 100.

The optical section 10 includes a housing 122, a light reflector 121, a light source 11, and an optical lens 124. A rear end of the housing 122 is coupled to the heat dissipation section 20, and a front end of the housing 122 is provided with the optical lens 124. The light reflector 121 and the light source 11 are received in the housing 122. The housing 122 provides protection for the light source 11 and the light reflector 121. The light reflector 121 is cone-shaped and tapers from the front end towards the rear end of the housing 122. The light reflector 121 has a rear end disposed adjacent to the heat dissipation section 20 and defined with an opening 123 for mounting of the light source 11 in the opening 123, and a front end mounted to the front end of the housing 122. The light reflector 121 and the optical lens 124 provide luminescence characteristics for the light source 11.

The electrical section 30 provides drive power, control circuit and power management for the light source 11. The electrical section 30 includes a casing 32 having a front end connected with the heat dissipation section 20, a lamp head 33 at a rear end of the casing 32, a mounting plate 34 mounted at the front end of the casing 32 and located between the electrical section 30 and the heat dissipation section 20, and a circuit board 31 disposed in the casing 32. A plurality of air exchanging holes 322 are defined in the casing 32 at a position adjacent to the lamp head 33 of the casing 32. The air exchanging holes 322 communicate an interior of the electrical section 30 with an environment and are utilized for dissipating heat of the circuit board 31. The circuit board 31 is mounted in the casing 32 of the electrical section 30 through a mounting mechanism which includes a socket 321 and a connecting pole 312. The socket 321 is attached to an inner surface of the casing 32. The connecting pole 312 connects the circuit board 31 with the socket 321.

The electrical section 30 is further provided with a plurality of electrical wires 114, 311 connected with the circuit board 31. The electrical wires 114 extend through the mounting plate 34 and electrically connect with the light source 11. The electrical wires 311 electrically connect with the lamp head 33, whereby the LED illuminating device 100 can get power from an external power source via the lamp head 33.

The heat dissipation section 20 is provided with a heat dissipation device 200. The heat dissipation device 200 includes a heat sink 23, a mounting seat 24 provided at a bottom side of the heat sink 23, and at least a heat pipe 22 thermally connecting the mounting seat 24 with the heat sink 23. In the preferred embodiment, there are two heat pipes 22. The mounting seat 24 extends into the optical section 10. The light source 11 and the rear end of the light reflector 121 are mounted to the mounting seat 24. The heat sink 23 is generally made of aluminum or aluminum alloy via an aluminum extrusion method. The mounting seat 24 is preferably made of a metal material having a higher heat conductivity than the material forming the heat sink 23. For example, the mounting seat 24 may be made of copper or copper alloy.

Figure 2:
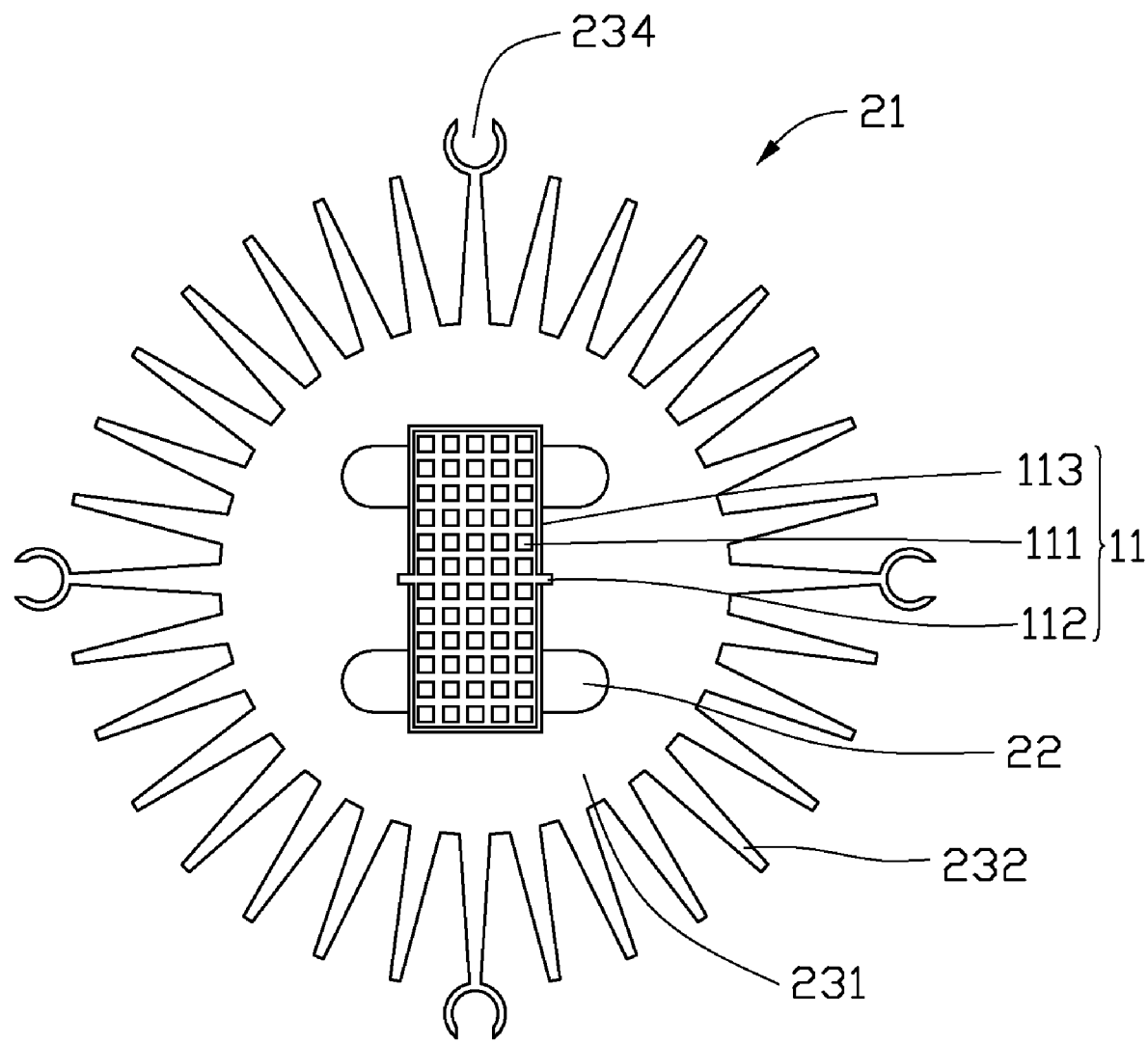
FIG. 2 is a bottom, plan view of a light engine of the LED illuminating device of FIG. 1.
Figure 3:
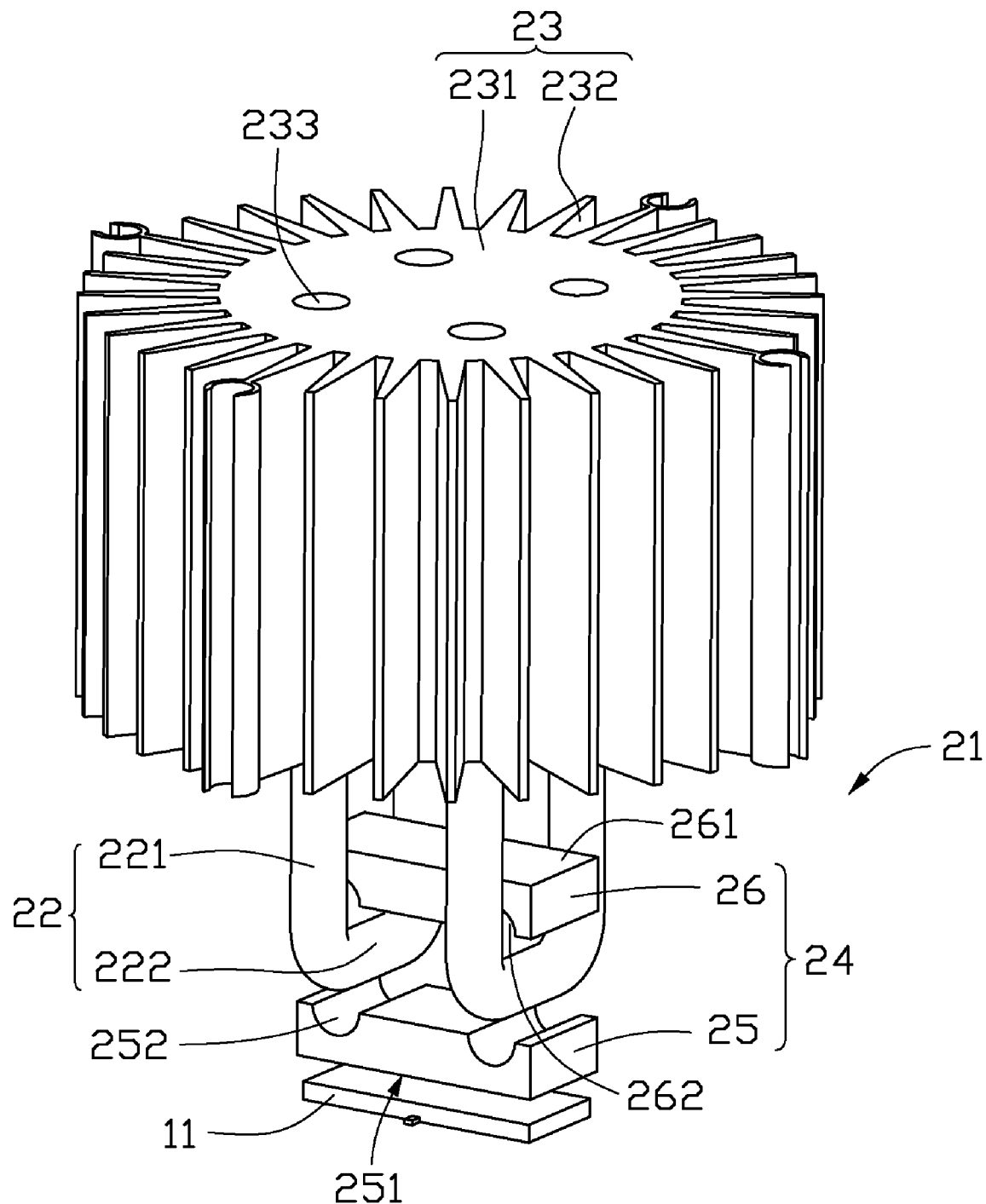
FIG. 3 is an exploded, isometric view of the light engine of FIG. 2.

The heat dissipation device 200 and the light source 11 cooperatively form a light engine 21 for the LED illuminating device 100. Referring to FIGS. 2-3, various components of the light engine 21 are shown in greater details. The heat sink 23 includes a solid, column-shaped metal base 231, and a plurality of metal fins 232 extending radially and outwardly from a circumferential surface of the metal base 231.

Each of the two heat pipes 22 is generally U-shaped, including an evaporating portion 222, and two condensing portions 221 extending upwardly and perpendicularly from two opposite ends of the evaporating portion 222, respectively (FIG. 3). The metal base 231 is provided with four through holes 233 for receiving the condensing portions 221 of the heat pipes 22 therein.

The mounting seat 24 includes a top mounting block 26 and a bottom mounting block 25. A top surface 261 of the top mounting block 26 is directly attached to a bottom surface of the metal base 231 so that the top mounting block 26 can directly transfer heat to the metal base 231. A bottom surface of the top mounting block 26 is provided with two semi-circular grooves 262. A top surface of the bottom mounting block 25 is provided with two semi-circular grooves 252 corresponding to the two semi-circular grooves 262 of the top mounting block 26. When the top and the bottom mounting blocks 26, 25 are mounted together, the semi-circular grooves 262, 252 cooperatively form two circular grooves for fittingly receiving the evaporating portions 222 of the two heat pipes 22 therein, respectively. Alternatively, the top mounting block 26 and the bottom mounting block 25 can be integrally formed as a single metal block, and two circular grooves are defined through the single integrally formed metal block for fittingly receiving the evaporating portions 222 of the heat pipes 22. Furthermore, the top mounting block 26 can be omitted and the heat pipes 22 are directly received in semi-circular grooves 252 of the bottom mounting block 25. Moreover, the evaporating portions 222 of the heat pipes 22 can be flattened, and the grooves 262, 252 defined in the mounting seat 24 accordingly have rectangular shape so as to match the shape of the evaporating portions 222 of the heat pipes 22.

The light source 11 is attached to a bottom surface 251 of the bottom mounting block 25, whereby heat generated by the light source 11 is transferred to and effectively dissipated by the heat dissipation device 200. Some of the metal fins 232 each are provided with a mounting claw 234 at a free end thereof. Fasteners such as screws (not shown) are utilized to extend through the mounting claw 234, to thereby mount the heat dissipation section 20 between the electrical section 30 and the optical section 10.

The light source 11 includes a substrate 113 and a plurality of LEDs 111 (light emitting diodes) electrically connected to the substrate 113. A pair of electrodes 112 are provided at opposite sides of the substrate 113 for electrically connecting the LEDs 111 with the electrical wires 114 of the electrical section 30. Alternatively, electrical circuits may be directly formed on the bottom surface 251 of the bottom mounting block 25, and the LEDs 111 are directly attached to the bottom surface 251 of the bottom mounting block 25, whereby the substrate 113 can be omitted and a heat resistance between the LEDs 111 and the bottom mounting block 25 is reduced.

In the present illuminating device 100, heat pipe technology is utilized to effectively remove the heat generated by the LEDs 111. The heat of the LEDs 111 is firstly transferred to the bottom mounting block 25. A portion of the heat transferred to the bottom mounting block 25 is thereafter transferred to the top mounting block 26, and then to the metal base 231 via the top mounting block 26. Another portion of the heat transferred to the bottom mounting block 25 is thereafter rapidly transferred to the evaporating portions 222 of the heat pipes 22, and then to the metal base 231 via the heat pipes 22. The heat is finally and effectively dissipated by the heat sink 23.

Figure 4:
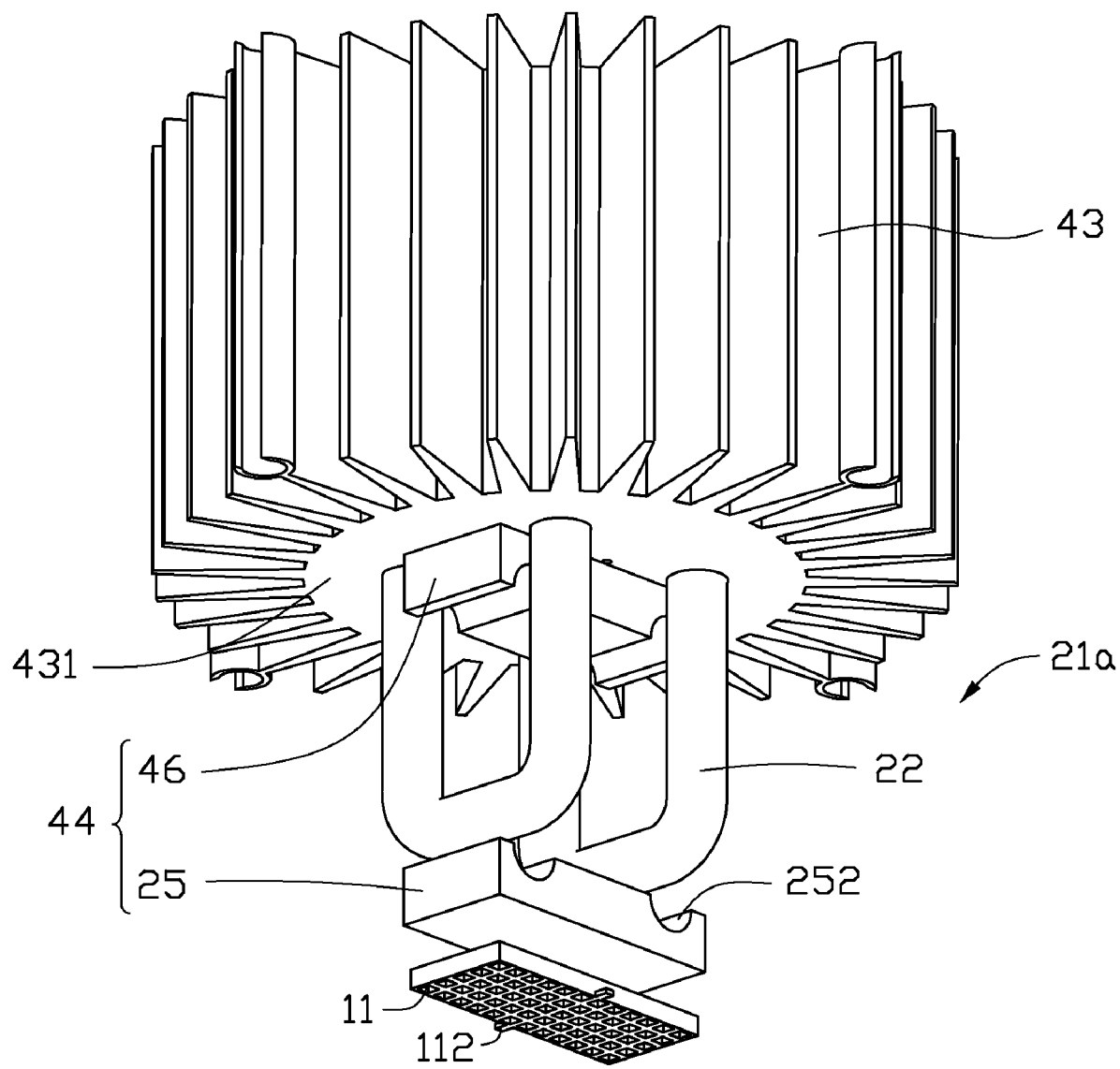
FIG. 4 is an exploded, isometric view of a light engine in accordance with an alternative embodiment.

FIG. 4 illustrates a light engine 21a according to an alternative embodiment of the present invention. In the present embodiment, the top mounting block 46 of the mounting seat 44 is integrally formed with the metal base 431 of the heat sink 43 so as to reduce a thermal resistance between the heat pipes 22 and the heat sink 43. In other words, the top mounting block 46 and the heat sink 43 are formed as a single piece.

Figure 5:
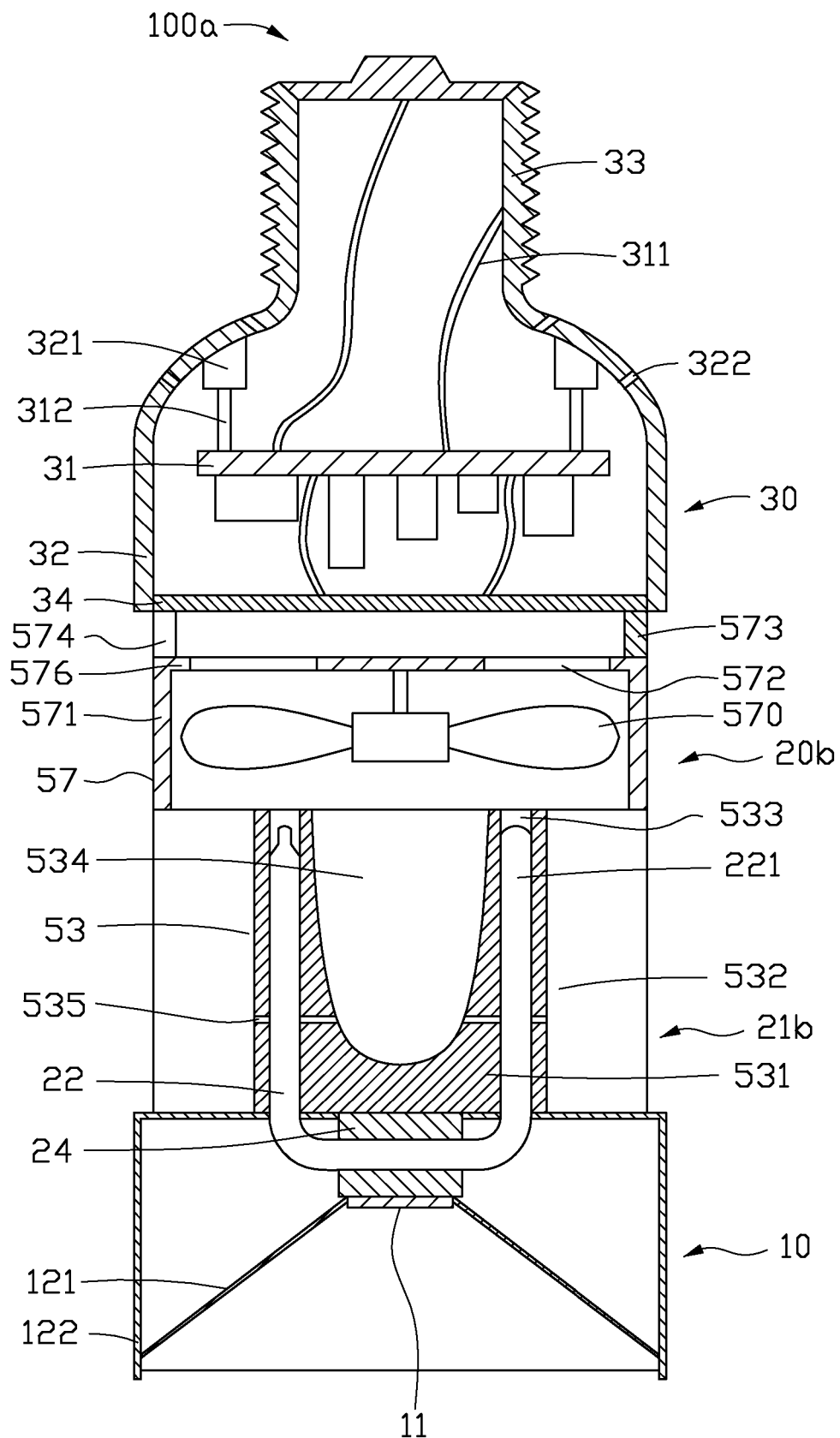
FIG. 5 is a cross-sectional view of an LED illuminating device in accordance with another embodiment of the present invention.

FIG. 5 is a cross-sectional view of an LED illuminating device 100a in accordance with another embodiment of the present invention. The difference between the present LED illuminating device 100a and the LED illuminating device 100 illustrated in the previous embodiment lies in the heat dissipation section 20b. In the present embodiment, the heat dissipation section 20b further includes a cooling fan 57 provided between the electrical section 30 and the heat sink 53. The cooling fan 57 includes a fan housing 571 and an impeller 570 rotatably mounted to a top plate 576 of the fan housing 571. A plurality of air venting holes 572 are defined in the top plate 576 of the fan housing 571. An annular spacer 573 is interposed between the cooling fan 57 and the electrical section 30. A plurality of air venting holes 574 are defined through a circumferential periphery of the spacer 573.

The heat sink 53 of the light engine 21b includes a column-shaped metal base 531, a plurality of metal fins 532 extending radially and outwardly from a circumferential surface of the metal base 531. A blind hole 534 is defined at a top portion of the metal base 531 in order to increase the heat exchange surface of the heat sink 53. The blind hole 534 extends vertically from a top surface of the metal base 531 toward a bottom portion of the metal base 531. The blind hole 534 has a size gradually decreased as the blind hole 534 extends from the top surface of the metal base 531 towards the bottom portion of the metal base 531, so that the blind hole 534 has a smooth, curved inner surface.

A plurality of small-sized air venting holes 535 are radially defined in the bottom portion of the metal base 531. The air venting holes 535 communicate a bottom of the blind hole 534 with an outside of the metal base 531. The blind hole 534 is surrounded by the through holes 533 defined in the metal base 531 for receiving the condensing portions 221 of the heat pipes 22.

The cooling fan 57 can be configured to begin operation as soon as the LEDs 111 start emitting light. Alternatively, the cooling fan 57 can be automatically controlled to rotate when a junction temperature of the LEDs 111 reaches a specified temperature value after the LEDs 111 have worked for a time period. The cooling fan 57 does not operate when the junction temperature of the LEDs 111 is below the specified temperature value. When the cooling fan 57 does not operate, air in the blind hole 534 is heated by the heat of the LEDs 111 transferred to the heat sink 53 and floats upwardly. The heated, upwardly floating air escapes to ambient atmosphere via the air venting holes 572 defined in the top plate 576 of the fan housing 571 and the air venting holes 574 defined in the spacer 573. Cooling air in the ambient atmosphere enters into the blind hole 534 via the air venting holes 535 defined in the metal base 531, whereby a natural air convection is circulated through the heat sink 53.

When the cooling fan 57 operates, the cooling fan 57 inhales air from the ambient atmosphere via the air venting holes 572 defined in the top plate 576 of the fan housing 571 and the air venting holes 574 defined in the spacer 573. An airflow generated by the cooling fan 57 flows towards the heat sink 53. A portion of the airflow directly flows through to the metal fins 532 of the heat sink 53, while another portion of the airflow flows into the blind hole 534 of the metal base 531, and further to the outside of the metal base 531 through the air venting holes 535 defined in the metal base 531, whereby a forced air convection is circulated through the heat sink 53.

Figure 6:
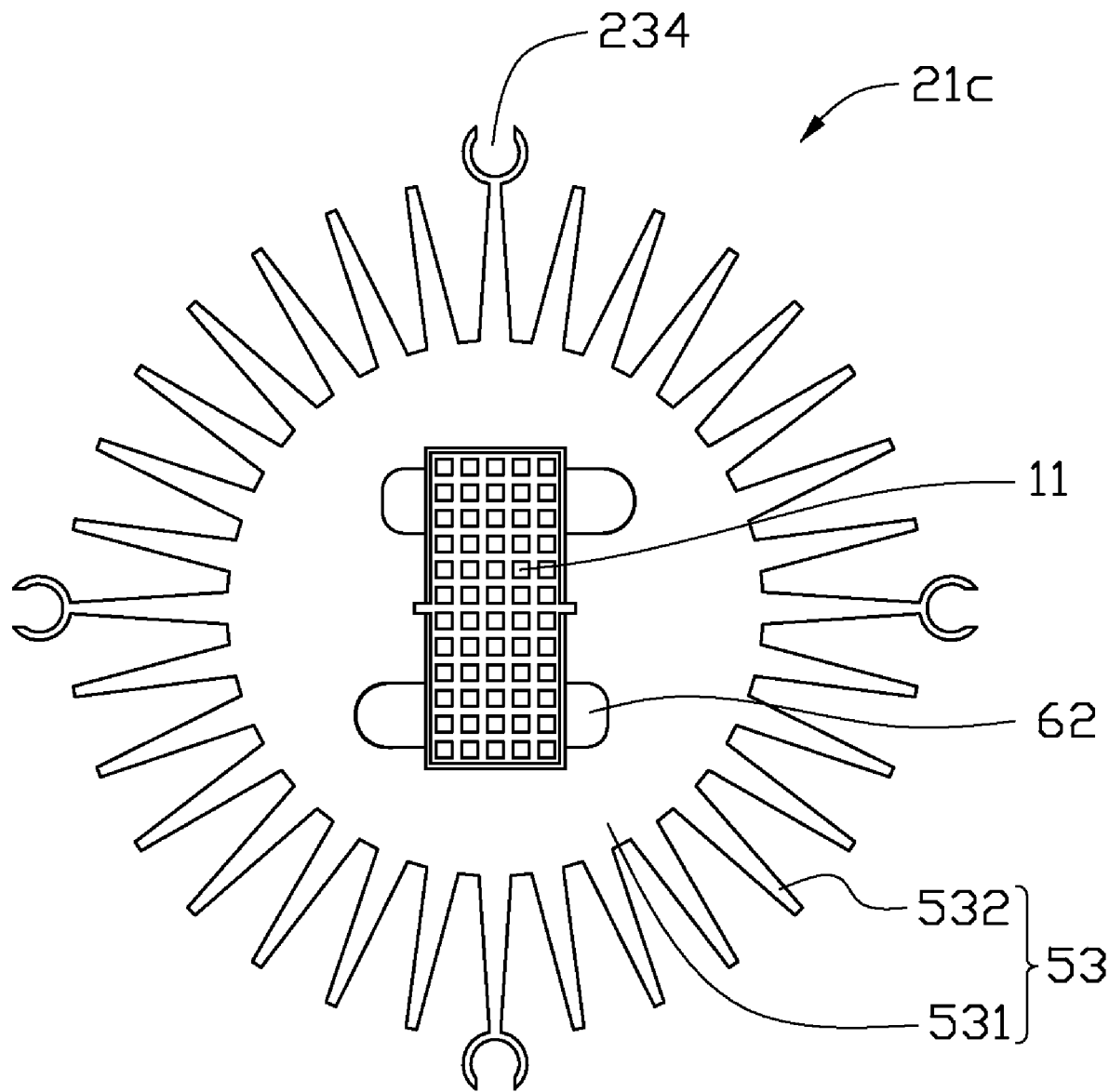
FIG. 6 is a bottom, plan view of a light engine in accordance with a further alternative embodiment.
Figure 7:
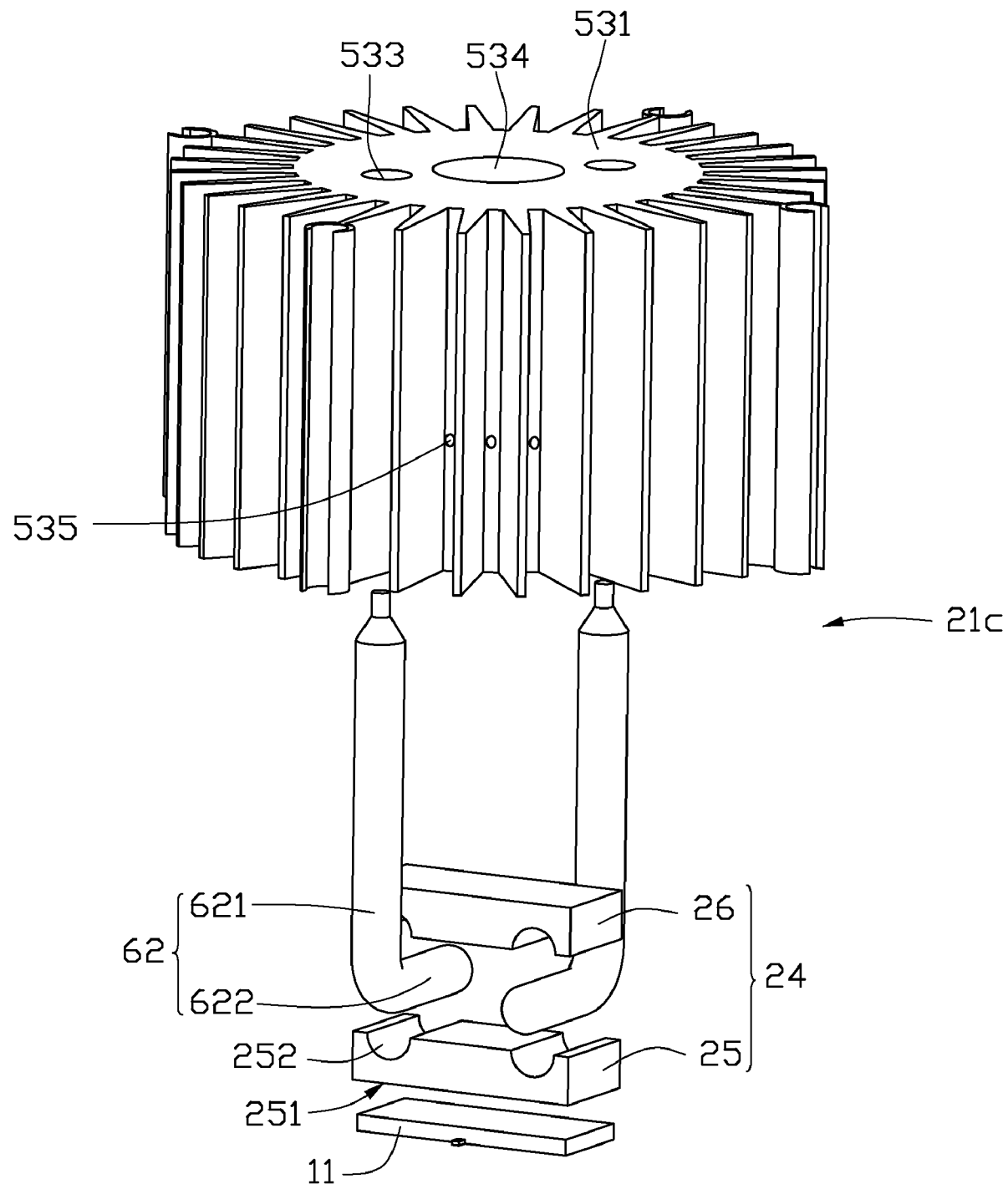
FIG. 7 is an exploded, isometric view of the light engine of FIG. 6.

Referring to FIGS. 6-7, a light engine 21c according to a further alternative embodiment of the present invention is illustrated. The light engine 21c includes a heat sink 53 consisting of a column-shaped metal base 531 and a plurality of metal fins 532 extending radially and outwardly from a circumferential surface of the metal base 531, a mounting seat 24 provided at a bottom side of the metal base 531, and two heat pipes 62 thermally connecting the mounting seat 24 with the metal base 531. The difference between the present light engine 21c and the light engine 21b of FIG. 5 lies in the heat pipes 62. In the present embodiment, each of the heat pipes 62 is L-shaped, including an evaporating portion 622 and a condensing portion 621 extending upwardly and perpendicularly from one end of the evaporating portion 622. Therefore, in this embodiment, there are only two through holes 533 in the metal base 531 receiving the two condensing portions 621 of the two heat pipes 62, and the blind hole 534 is located between the two through holes 533.

It is to be understood, however, that even though numerous characteristics and advantages of the present invention have been set forth in the foregoing description, together with details of the structure and function of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An LED illuminating device, comprising:
an optical section disposed at a front end of the LED illuminating device, a light source being provided in the optical section;
an electrical section disposed at a rear end of the LED illuminating device and electrically connecting with the light source; and
a heat dissipation section disposed between the optical section and the electrical section, the heat dissipation section being provided with a heat dissipation device, the heat dissipation device comprising:
a heat sink comprising a solid metal base and a plurality of metal fins extending radially and outwardly from the metal base, the metal base being provided with a through hole;
a mounting seat to which the light source is attached; and
a heat pipe connecting the mounting seat with the heat sink, the heat pipe comprising an evaporating portion and a condensing portion, the condensing section of the heat pipe being fittingly received in the through hole of the metal base, and the evaporating portion of the heat pipe being mounted to the mounting seat;
wherein the mounting seat comprises a top mounting block and a bottom mounting block, and the evaporating portion of the heat pipe is sandwiched between the top mounting block and the bottom mounting block; and
wherein the top mounting block is attached to the metal base of the heat sink.

2. The LED illuminating device of claim 1, wherein each of the top mounting block and the bottom mounting block is provided with a semi-circular groove, and the evaporating portion of the heat pipe is fittingly received in the grooves of the top mounting block and the bottom mounting block.

3. The LED illuminating device of claim 1, wherein the heat pipe is one of U-shaped and L-shaped.

4. The LED illuminating device of claim 1, wherein the metal base is provided with a blind hole, the blind hole extends vertically from a top portion toward a bottom portion of the metal base, an air venting hole is radially defined in the bottom portion of the metal base, and the air venting hole communicates a bottom of the blind hole with an outside of the metal base.

5. The LED illuminating device of claim 4, further comprising a cooling fan disposed between the electrical section and the heat sink, the cooling fan being configured to provide an airflow towards the blind hole of the metal base.

6. The LED illuminating device of claim 5, wherein the light source includes an LED, and the cooling fan is activated to operate when a junction temperature of the LED reaches a specified temperature value.

7. The LED illuminating device of claim 5, further comprising an annular spacer interposed between the cooling fan and the electrical section, and an air venting hole is defined through a circumferential periphery of the spacer.

8. The LED illuminating device of claim 5, wherein the cooling fan comprises a fan housing and an impeller, the impeller is mounted to a top plate of the fan housing, and the top plate is provided with an air venting hole.

9. The LED illuminating device of claim 1, wherein the electrical section comprises a casing and a circuit board received in the casing, the casing is provided with an air venting hole, the air venting hole communicates an interior of the casing with an outside of the casing.

10. A light engine of an LED illuminating device, comprising:
a mounting seat;
a light source being attached to the mounting seat;
a heat sink comprising a solid metal base and a plurality of metal fins extending radially and outwardly from the metal base, the metal base being provided with a through hole;

a heat pipe connecting the mounting seat with the heat sink, the heat pipe comprising an evaporating portion and a condensing portion, the condensing section of the heat pipe being fittingly received in the through hole of the metal base, the evaporating portion of the heat pipe being mounted to the mounting seat.

11. The light engine of the LED illuminating device of claim 10, wherein the mounting seat comprises a top mounting block and a bottom mounting block, the evaporating portion of the heat pipe is sandwiched between the top mounting block and the bottom mounting block, and the top mounting block is attached to the metal base of the heat sink.

12. The light engine of the LED illuminating device of claim 10, wherein the metal base is provided with a blind hole, the blind hole extends vertically from a top portion till a bottom portion of the metal base, an air venting hole is radially defined in the bottom portion of the metal base, and the air venting hole communicates a bottom of the blind hole with an outside of the metal base.

13. The light engine of the LED illuminating device of claim 12, further comprising a cooling fan over the heat sink, the cooling fan being configured to provide an airflow towards the blind hole of the metal base.

14. An LED illuminating device, comprising:
an optical section disposed at a front end of the LED illuminating device, a light source being provided in the optical section;
an electrical section disposed at a rear end of the LED illuminating device and electrically connecting with the light source; and
a heat dissipation section disposed between the optical section and the electrical section, the heat dissipation section being provided with a heat dissipation device, the heat dissipation device comprising:
a heat sink comprising a solid metal base and a plurality of metal fins extending radially and outwardly from the metal base, the metal base being provided with a through hole;
a mounting seat to which the light source is attached; and
a heat pipe connecting the mounting seat with the heat sink, the heat pipe comprising an evaporating portion and a condensing portion, the condensing section of the heat pipe being fittingly received in the through hole of the metal base, and the evaporating portion of the heat pipe being mounted to the mounting seat;
wherein the mounting seat comprises a top mounting block and a bottom mounting block, and the evaporating portion of the heat pipe is sandwiched between the top mounting block and the bottom mounting block; and
wherein the top mounting block is an integral portion of the metal base of the heat sink.

* * * * *